United States Patent [19]

Yamazaki

[11] Patent Number: 4,559,552
[45] Date of Patent: Dec. 17, 1985

[54] PIN SEMICONDUCTOR PHOTOELECTRIC CONVERSION DEVICE WITH TWO OXIDE LAYERS

[75] Inventor: Shunpei Yamazaki, Tokyo, Japan

[73] Assignee: Semiconductor Energy Laboratory Co., Ltd., Tokyo, Japan

[21] Appl. No.: 497,703

[22] Filed: May 24, 1983

[30] Foreign Application Priority Data

May 24, 1982 [JP] Japan .................................. 57-87800

[51] Int. Cl.$^4$ .......................................... H01L 29/12
[52] U.S. Cl. ...................................... 357/58; 357/59; 357/2; 357/30
[58] Field of Search ............... 357/58, 59, 2, 30, 30 K

[56] References Cited

U.S. PATENT DOCUMENTS

| | | | |
|---|---|---|---|
| 4,401,840 | 8/1983 | Chitre | 357/59 X |
| 4,433,202 | 2/1984 | Maruyama et al. | 357/59 X |
| 4,434,318 | 2/1984 | Gibbons | 357/30 X |
| 4,442,310 | 4/1984 | Carlson et al. | 357/30 X |

FOREIGN PATENT DOCUMENTS

| | | |
|---|---|---|
| 55-108780 | 8/1980 | Japan . |
| 2083703 | 3/1982 | United Kingdom ............. 357/30 K |

OTHER PUBLICATIONS

Carlson et al., "Amorphous Silicon Solar Cell," *Applied Physics Letters*, vol. 28, No. 11, Jun. 1976, pp. 671–673.

*Primary Examiner*—Andrew J. James
*Assistant Examiner*—William A. Mintel
*Attorney, Agent, or Firm*—Murray, Whisenhunt and Ferguson

[57] ABSTRACT

A PIN type semiconductor photoelectric conversion device is provided with a non-single-crystal semiconductor laminate member which comprises a first non-single-crystal semiconductor layer of a first conductivity, on I-type second non-single-crystal semiconductor layer and a third non-single-crystal semiconductor layer of a second conductivity type, and first and second electrodes which make ohmic contact with the first and third non-single-crystal semiconductor layers, respectively.

The first non-single-crystal semiconductor layer of the non-single-crystal semiconductor laminate member is formed by a non-single-crystal semiconductor layer on the side of incidence of light. And the second electrode is formed by a reflective electrode.

18 Claims, 16 Drawing Figures

PIN SEMICONDUCTOR PHOTOELECTRIC CONVERSION DEVICE WITH TWO OXIDE LAYERS

BACKGROUND OF THE INVENTION

1. Field of the Invention

The present invention relates to a PIN type semiconductor photoelectric conversion device using a non-single-crystal semiconductor.

2. Description of the Prior Art

Heretofore there has been proposed a PIN type semiconductor photoelectric conversion device using a non-single-crystal semiconductor.

The PIN type semiconductor photoelectric conversion device comprises a laminated member having a first non-single-crystal semiconductor layer of a first conductivity type (P or N conductivity type), an I-type second non-single-crystal semiconductor layer and a third non-single-crystal semiconductor layer of a second conductivity type reverse from the first conductivity type (that is, N-type when the first non-single-crystal semiconductor layer is P-type, or P-type when the latter is N-type), and first and second electrodes making ohmic contact with the first and third non-single-crystal semiconductor layers, respectively.

When irradiated by light on the side of the first non-single-crystal semiconductor layer of the laminated member, such a PIN type semiconductor photoelectric conversion device performs a photoelectric conversion through the following mechanism. That is to say, the incident light passes through the first non-single-crystal semiconductor layer to reach the second non-single-crystal semiconductor layer, wherein it is absorbed. In consequence, carriers (electron-holes pairs) are created in the second non-single-crystal semiconductor layer. The carriers migrate into the first and third non-single-crystal semiconductor layers and then reach the first and second electrodes. Accordingly, a current corresponding to the intensity of the incident light is supplied to a load connected across the first and second electrodes.

In such a PIN type semiconductor photoelectric conversion device, as described above, incident light passes through the first non-single-crystal semiconductor layer to reach the second non-single-crystal semiconductor layer, wherein it is absorbed to create carriers therein.

However, all the light incident on the second non-single-crystal semiconductor layer through the first non-single-crystal semiconductor layer is not always absorbed by the second non-single-crystal semiconductor layer but a portion of the incident light passes through the third non-single-crystal semiconductor layer towards the second electrode.

IN the PIN type semiconductor photoelectric conversion device of the conventional structure described above, the second electrode does not reflect light but, if it does, it has only a small reflection coefficient. On account of this, in the prior art PIN type semiconductor photoelectric conversion device, that portion of the incident light which passes through the third non-single-crystal semiconductor layer towards the second electrode is scarcely utilized for photoelectric conversion and is dissipated in the second electrode.

Therefore, the conventional PIN type semiconductor photoelectric conversion device possesses the defects of low utilization efficiency of incident light and hence low photoelectric conversion efficiency.

Furthermore, in the PIN type semiconductor photoelectric conversion device of the above-described structure, the carriers created in the second non-single-crystal semiconductor layer migrate into the first and third non-single-crystal semiconductor layers and thence to the first and second electrodes. It is therefore desired that the first and second electrodes make excellent ohmic contact with the first and third non-single-crystal semiconductor layers, respectively.

It is general practice, in the conventional PIN type semiconductor photoelectric convension device that when the first non-single-crystal semiconductor layer of the laminated member is a non-single-crystal semiconductor on the side of incidence of light, the first electrode is formed by a light transparent conductive layer and the second electrode is formed of metal.

However, the first and second electrodes in the conventional PIN type semiconductor photoelectric convension device are formed without regard to the impurities contained in the first and third non-single-crystal semiconductor layers for imparting thereto respective conductivity types.

On account of this, the ohmic contact between the first electrode and the first non-single-crystal semiconductor layer and between the second electrode and the third non-single-crystal semiconductor layer is not very good in the conventional PIN type semiconductor photoelectric convension device.

Accordingly, the prior art PIN type semiconductor photoelectric conversion device has the defect of low photoelectric conversion efficiency in this regard also.

SUMMARY OF THE INVENTION

It is therefore an object of the present invention to provide a novel PIN type semiconductor photoelectric conversion device which is free from the abovesaid defects of the prior art.

The PIN type semiconductor photoelectric conversion device of the present invention comprises, as is the case with the aforementioned conventional PIN structure which has a first non-single crystal semiconductor layer of a first conductivity type, an I-type second non-single-crystal semiconductor layer and a third non-single-crystal semiconductor layer of a second conductivity type, and first and second electrodes which make ohmic contact with the first and third non-single-semiconductor layers, respectively.

In the PIN type photoelectric conversion device of the present invention, however, when the first non-single-crystal semiconductor layer is a non-single-crystal semiconductor layer on the side of incidence of light, the second electrode has a a high coefficient reflection.

Accordingly, that portion of light incident on the second non-single-crystal semiconductor layer which is not absorbed by the second non-single-crystal semiconductor layer and passes through the third non-single-crystal semiconductor layer towards the second electrode is reflected by the second electrode back to the second non-single-crystal semiconductor layer.

Thus the PIN type semiconductor photoelectric conversion device of the present invention exhibits a high photoelectric conversion efficiency.

Furthermore, according to the PIN type semiconductor photoelectric conversion device of the present invention, the second electrode comprises a light transparent conductive layer on the third non-single-crystal semiconductor layer and a reflective conductive layer formed of metal on the light transparent conductive layer. The light transparent conductive layer is formed of a material selected in accordance with the impurity contained in the third non-single-crystal semiconductor layer. Therefore, excellent ohmic contact is obtained between the second electrode and the third non-single-crystal semiconductor layer.

Accordingly, high photoelectric conversion efficiency can be obtained with the PIN type semiconductor photoelectric conversion device of the present invention.

Other objects, features and advantages of the present invention will become more fully apparent from the following detailed description taken in conjunction with the accompanying drawings.

DESCRIPTION OF THE PREFERRED EMBODIMENTS

Figure 1:
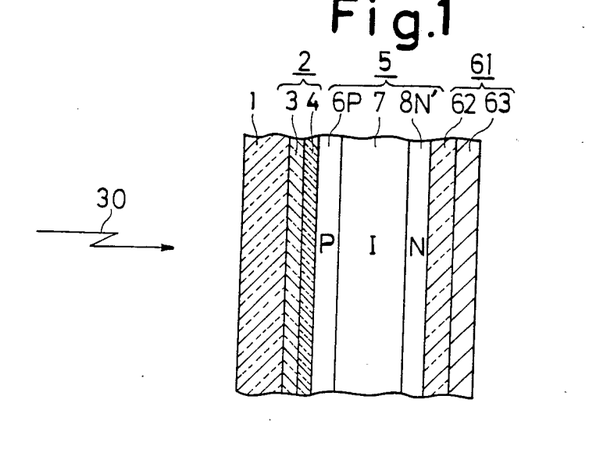
FIG. 1 is an enlarged sectional view schematically illustrating a first embodiment of the PIN type semiconductor photoelectric conversion device of the present invention.

FIG. 1 illustrates a first embodiment of the PIN semiconductor photoelectric conversion device of the present invention, which has, as a support member 1, a light transparent insulating substrate made from, for example, glass, on which is formed a first electrode 2.

The electrode 2 is transparent to light and comprises a light transparent conductive layer 3 which is formed, for instance, of an indium oxide containing 1 to 10 wt% of a tin oxide and deposited on the light transparent insulating substrate 1 and a light transparent conductive layer 4 which is formed of a tin oxide containing 1 to 10 wt% of an antimony oxide and deposited on the light transparent conductive layer 3. The electrode 2 is, for example, 600 to 800 Å thick.

On the electrode 2 is formed a non-single-crystal semiconductor laminate member 5, which has first, second and third non-single-crystal semiconductor layers 6P, 7 and 8N'.

The non-single-crystal semiconductor layer 6P is P-type and formed on the light transparent conductive layer 4 of the electrode 2 to a thickness, for example, of 5 to 300 Å, in particular, 70 to 130 Å. Furthermore, the non-single-crystal semiconductor layer 6P is formed of silicon or a semiconductor consisting principally of silicon, for example, silicon carbide expressed by $Si_xC_{1-x}$ ($0<x<1$) and has a fibrous structure.

Such a non-single-crystal semiconductor layer 6 is distinguished from a non-single-crystal semiconductor layer having a microcrystalline structure of the same semiconductor material.

Figure 2A:
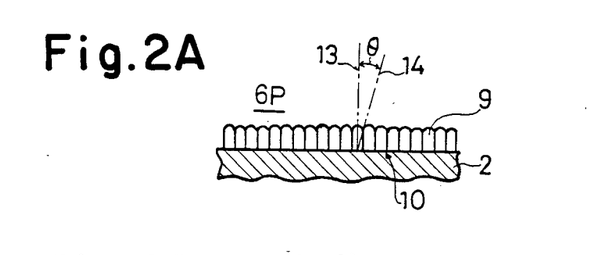
FIG. 2A is a diagram drawing the constructions of a non-single-crystal semiconductor layer of a fibrous structive in the PIN type semiconductor photoelectric of the present invention conversion device depicted in FIG. 1.
Figure 3A:
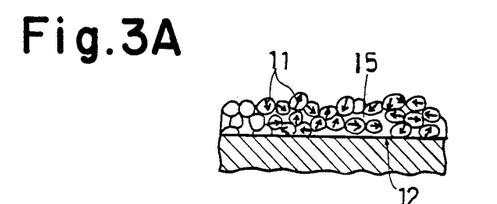
FIGS. 3A and 3B are diagrams respectively showing the construction and an electronic diffraction image of a non-single-crystal semiconductor layer of a microcrystalline structure which is compared with the non-single-crystal semiconductor layer of the fibrous structure according to the present invention.

That is, the non-single-crystal semiconductor layer 6P having the fibrous structure is formed by crystals as is the case with the non-single-crystal semiconductor layer having microcrystalline structure. In the case where the non-single-crystal semiconductor layer 6P has the fibrous structure, the crystals are grown in a direction perpendicular to a surface 10 of the electrode 2 and columnar in shape as indicated by 9 in FIG. 2A and the columnar crystals are arranged side by side in the direction parallel to the surface 10 of the electrode 2. In contrast thereto, in the case of the non-single-crystal semiconductor layer having the microcrystalline structure, non-columnar crystals 11 having a grain size of 10 to 100 Å are piled up at random on the surface on which they are formed as shown in FIG. 3A.

When the non-single-crystal semiconductor layer 6P having fibrous structure is formed of silicon, the crystals 9 each have a crystal plane (110) and their <110> axes extend linearly or spirally along a line 13 perpendicular to the surface 10 of the electrode 2, or along line 14 inclined at an angle 0 within ±30°, in particular, ±10° to the line 13. On the other hand, when the non-single-crystal semiconductor layer having microcrystalline structure is similarly formed of silicon, the crystals 11 each have the crystal plane (110) but their <110> axes extend at random with respect to the surface 12 as shown in FIG. 3A.

Moreover, in the non-single-crystal semiconductor layer 6P having the fibrous structure, adjacement crystals 9 are coupled together with a low degree of regularity and, consequently, there is set up substantially no grain boundary in which dangling bonds are centered between adjacent crystals 9. In contrast thereto, in the non-single-crystal semiconductor layer having microcrystalline structure, there is formed a grain boundary 15 in which dangling bonds are centered between adjacent crystals 11.

Also, the non-single-crystal semiconductor layer 6P having fibrous structure is small in lattice strain as compared with the non-single-crystal semiconductor layer having the microcrystalline structure.

Figure 2B:
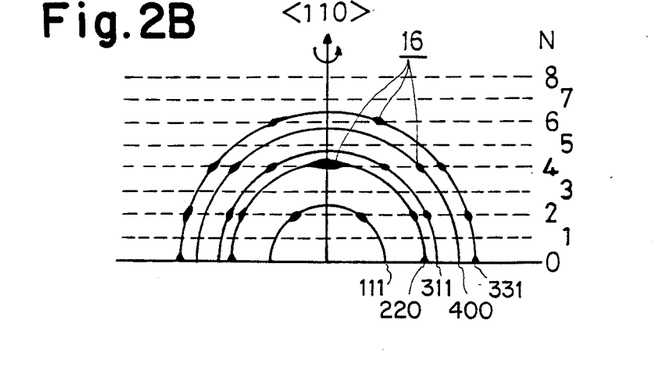
FIG. 2B is a diagram showing an electronic diffraction image of the non-single-crystal semiconductor layer of the fibrous structure in the PIN type semiconductor photoelectric conversion device of the present invention depicted in FIG. 1.
Figures 3B, 5:
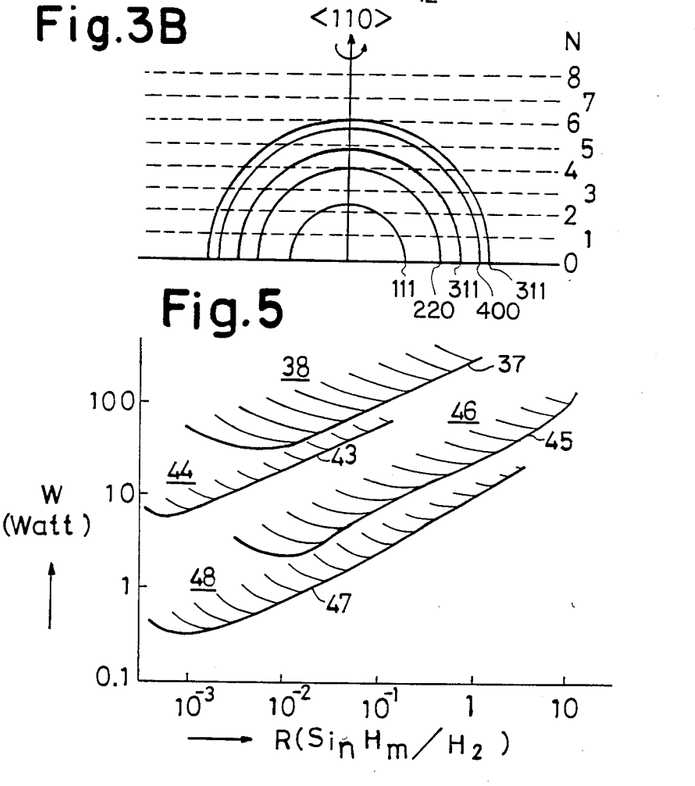
FIG. 5 is a graph showing the relationship of the ratio $R(Si_nH_m/H_2)$ between silane gas $(Si_nH_m)$ and hydrogen gas $(H_2)$ and the power W of high frequency electric energy, for explaining an embodiment of the method of making the non-single-crystal semiconductor layer of the fibrous structure in the PIN type semiconductor photoelectric conversion device of the present invention shown in FIG. 1.

In addition, when the non-single-crystal semiconductor layer 6P having fibrous structure is formed of silicon, its electronic diffraction image has many relatively wide spots 16 as shown in FIG. 2B, whereas, when the non-single-crystal semiconductor layer having the microcrystalline structure is likewise formed of silicon, its electronic diffraction image has no spots as shown in FIG. 3B. In FIGS. 2B and 3B, reference character N indicates the number of diffractions.

The non-single-crystal semiconductor layer 6P having the fibrous structure contains, as a recombination center neutralizer, hydrogen or a halogen, such as chlorine or fluorine.

The above-described non-single-crystal semiconductor layer 6 contained a recombination center neutralizer and having a fibrous structure is formed by such steps as described below.

Figure 4:
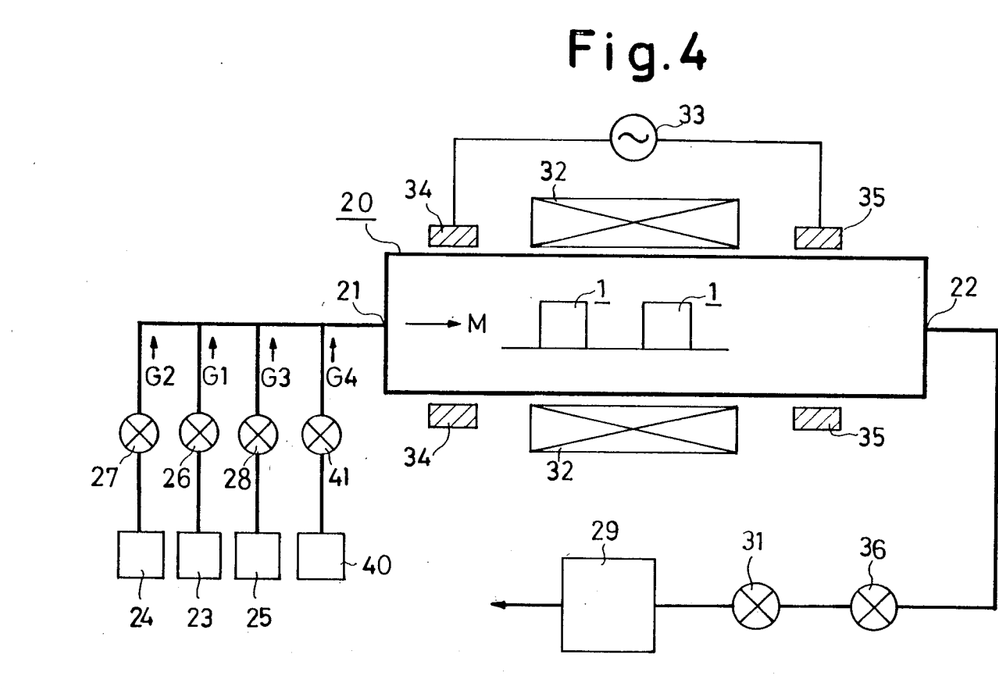
FIG. 4 is a schematic diagram illustrating, by way of example, the method and apparatus for making the non-single-crystalline semiconductor layer of the fibrous structure in the PIN type semiconductor photoelectric conversion device of the present invention.

As shown in FIG. 4, the light transparent insulating substrate 1 forming the electrode 2 is placed in a reaction chamber 20 between a gas inlet 21 and a gas outlet 22. In this case, a pair of insulating substrates 1 are assembled together in back-to-back relation and disposed in the reaction chamber 20. The insulating substrates 1 are heated by heating the interior of the reaction chamber 20 through using a heater 32 disposed therearound.

Then, semiconductor material gas (identified by G1), recombination center neutralizer gas (identified by G2), such as hydrogen gas or halogen gas such as chlorine or fluorine and P-type impurity material gas (identified by G3) are introduced into the reaction chamber 20 from a semiconductor material gas source 23, a recombination center neutralizer gas source 24 and a P-type impurity material gas source 25 via needle valves 26, 27 and 28, respectively, and via the gas inlet 21.

On the other hand, the reaction chamber 20 is exhausted by a rotary pump 29 via the gas outlet 22, a needle valve 36 and a stop valve 31.

As a result of this, a gas mixture M of the semiconductor material gas G1, the recombination center neutralizer gas G2 and the P-type impurity material gas G3 flows in the reaction chamber 20.

Then, the gas mixture M is made to undergo a chemical vapor reaction to deposit a non-single-crystal semiconductor layer on the electrode 2 of the light transparent insulating substrate 1.

In this case, the chemical vapor reaction is carried out by applying electric energy from a power source 33 to the stream of the gas mixture M via electrodes 34 and 35 disposed around the reaction chamber 20 so that a glow of plasma discharge may be produced in the gas mixture M. It is also possible to cause the chemical vapor reaction by applying optical energy to the stream of the gas mixture M from the outside of the reaction chamber 20 in a manner to produce a glow or plasma discharge, though not shown. The chemical vapor reaction may also be effected by a combination of the electric energy from the power source 33 and the optical energy.

The method of depositing a non-single-crystal semiconductor layer on the electrode 2 of the light transparent insulating substrate 1 through utilization of the abovesaid chemical vapor reaction is commonly referred to as the plasma CVD method using either one or both of electric and optical energies.

Accordingly, the non-single-crystal semiconductor layer 6P containing the recombination center neutralizer and having the fibrous structure is formed by the plasma CVD method using either one or both of electric and optical energies as is the case with conventional non-single-crystal semiconductor layers having the microcrystalline or amorphous structure.

However, the non-single-crystal semiconductor layer 6P containing the recombination center neutralizer and having the fibrous structure is formed by performing the chemical vapor reaction under the following conditions different from those used in the prior art for the formation of the non-single-crystal semiconductor layers having the microcrystalline and amorphous structures, respectively.

(a) The insulating substrate 1 is positioned in the reaction chamber 20 so that a stream of the gas mixture M may be passed over the top surface of the electrode 2 formed on the insulating substrate 1;

(b) the pressure in the reaction chamber 20 is set by controlling the needle valve 36 to 0.001 to 10 Torr; and (c) the chemical vapor reaction is carried out by controlling the heater 32 at 100° to 400° C., preferably 200° to 300° C., in terms of the temperature of the insulating substrate 1 in the reaction chamber 20.

In practice, in the case where the non-single-crystal semiconductor layer formed of silicon, containing hydrogen as the recombination center neutralizer and having the fibrous structure is obtained by using, as the semiconductor material gas G1, silane gas expressed by $Si_nH_m$ ($n \geq 1$, $m \geq 4$), hydrogen ($H_2$) as the recombination center neutralizer gas and diborane gas ($B_2H_6$) as the P-type impurity material gas and by applying high-frequency electric energy having a frequency of 13.56 MHz to the gas mixture M for the chemical vapor reaction, the pressure in the reaction chamber 20 is selected in the range of 0.01 to 1 Torr and the temperature in the reaction chamber 20 is selected, for instance, 250° C.

In this case, for example, when the flow quantity ratio ($B_2H_6/Si_nH_m$) of the diborane ($B_2H_6$) to the silane ($Si_nH_m$) is 0.5%, it is necessary for obtaining the non-single-crystal semiconductor layer 6P formed of silicon that the flow quantity ratio R ($Si_nH_m/H_2$) of the silane ($Si_nH_m$) to the hydrogen ($H_2$) and the output W (Watt) of the high-frequency electric energy bear such a relationship as indicated by the curve 37 in FIG. 5 which shows the lower limit of the output W of the high-frequency electric energy.

Accordingly, when the flow quantity ratio ($B_2H_6/Si_nH_m$) between the diborane ($B_2H_6$) and the silane ($Si_nH_m$) is 0.5%, the flow quantity ratio ($Si_nH_m/H_2$) of the silane ($si_nH_m$) to the hydrogen ($H_2$) and the output W of the high-frequency energy are selected to assume values corresponding to respective points in a region 38 upward of the curve 37 in FIG. 5.

Furthermore, electrodes 34 and 35 for applying the high-frequency electric energy to the gas mixture M are disposed to surround the reaction chamber 20 on the side of the gas inlet 21 and the gas outlet 22, respectively, so that the electric field of the glow or plasma discharge may be substantially parallel to the top surface of the insulating substrate 1.

Incidentally, it is preferable to carry out, prior to the formation of the non-single-crystal semiconductor layer 6P, a step of removing oxygen and water remaining on the interior surface of the reaction chamber 20 and the surface of the insulating substrate 1 until the quantity of oxygen in the reaction chamber 20 is reduced down to 0.1 ppm or below, preferably, 1 to 0.01 ppm or under. This oxygen removing step can be achieved in the following manner: At first, the reaction chamber 20 is exhausted by a pump 29 until the pressure in the chamber 20 is reduced down to about $1 \times 10^{-9}$ Torr, and hydrogen gas from the recombination center neutralizer gas source 24 is introduced into the reaction chamber 20 so that the pressure in the chamber 20 may be in the range of 0.1 to 1 Torr, and then the high-frequency electric energy is applied via the electrodes 34 and 35 to the stream of hydrogen gas to produce a plasma discharge.

In the case of forming the non-single-crystal semiconductor 6P as described previously after the above-said oxygen removing step, there exists, between the flow quantity ratio ($Si_nH_m/H_2$) of the silane ($Si_nH_m$) to the hydrogen ($H_2$) and the output W of the high-frequency electric energy, such a lower limit region characteristic as indicated by the curve 43 in FIG. 5 which is lower than the characteristic indicated by the curve 37. On account of this, the flow quantity ratio ($Si_nH_m/H_2$) between the silane ($Si_nH_m$) and the hydrogen ($H_2$) and the output W of the high-frequency electric energy can be selected over a wider range than in the aforementioned case as shown 44 in FIG. 5, and the non-single-crystal semiconductor layer 6P can be formed to have high electric conductivity.

In this way, the non-single-crystal semiconductor layer 6P containing the recombination center neutralizer and having the fibrous structure is formed on the electrode 2.

Figure 6:
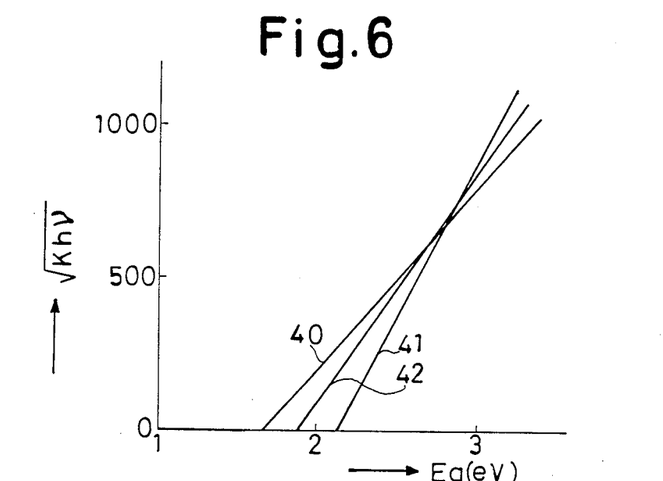
FIG. 6 is a graph showing the relationship of the light absorption coefficient, expressed by $\sqrt{kh\nu}$, of the non-single-crystal semiconductor layer of the fibrous structure to the optical energy gap in the PIN type semiconductor photoelectric conversion device of the present invention shown in FIG. 1 in comparison with the same relation of non-single-crystal semiconductor layers of amorphous and microcrystalline structures.

In the case of the thus formed non-single-crystal semiconductor layer 6P having the fibrous structure, the optical energy gap Eg (eV) and $\sqrt{kh\nu}$ (k being the light absorption coefficient, h the Planck's constant and $\nu$ the frequency of light) bear such a relationship as indicated by the line 40 in FIG. 6. The line 40 is the results of measurement obtained in the case where the non-single-crystal semiconductor layer 6P was formed of P-type silicon containing, as an impurity, 1% of boron relative to silicon through using diborane gas. In non-single-crystal semiconductor layers having the amorphous and the microcrystalline structure, respectively, the relationship between the energy gap Eg and $\sqrt{kh\nu}$ is such as indicated by the lines 41 and 42 in FIG. 6. The lines 41 and 42 are steeper than the line 40.

Accordingly, the light absorption coefficient of the non-single-crystal semiconductor layer 6P of the fibrous structure, formed as described above, is lower than the light absorption coefficients of the non-single-crystal semiconductor layers of the microcrystalline and the amorphous structure formed of the same semiconductor material.

Figure 7:
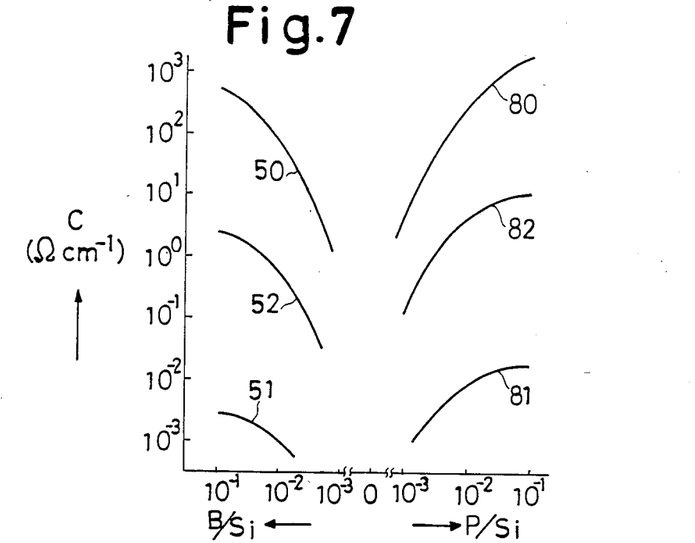
FIG. 7 is a graph showing the relationships of the electric conductivity C of the non-single-crystal semiconductor layer of the fibrous structure to the ratio of boron(B) and silicon(Si) and the ratio of phosphorus(P) and silicon(Si) in the PIN type semiconductor photoelectric conversion device of the present invention shown in FIG. 1.

In the case where non-single-crystal semiconductor layer 6P having the fibrous structure is formed of P-type silicon containing boron (B) as an impurity as referred to previously, the relationship of electric conductivity C $(\Omega cm)^{-1}$ to the ratio (B/Si) between the silicon (Si) and the boron (B) is such as indicated by the curve 51 in FIG. 7. In the cases of the non-single-crystal semiconductor layers of the amorphous and microcrystalline structures, the abovesaid relationship is such as indicated by the curves 51 and 52 in FIG. 7, respectively.

Accordingly, the non-single-crystal semiconductor layer 6P of the fibrous structure is higher in electric conductivity than the non-single-crystal semiconductor layers of the amorphous and microcrystalline structures which are formed of the same semiconductor material.

The above is a description of the non-single-crystal semiconductor layer 6P of the fibrous structure formed on the electrode 2.

The non-single-crystal semiconductor layer 7 of the laminated member 5 is I-type and formed, for example, 0.4 to 0.7$\mu$ thick on the non-single-crystal semiconductor layer 6P of the fibrous structure.

The non-single-crystal semiconductor layer 7 contains, as the recombination center neutralizer, hydrogen or a halogen, such as chlorine, fluorine and the like, as is the case with the non-single-crystal semiconductor layer 6P, but the layer 7 has the microcrystalline or amorphous structure. The amorphous structure herein mentioned includes a semi-amorphous structure which is intermediate between the microcrystalline and amorphous structures.

The non-single-crystal semiconductor layer 7 is formed by the known plasma CVD method using either one or both of electric and optical energies.

The non-single-crystal semiconductor layer 8N' of the laminated member 5 is N-type and formed, for instance, 100 to 300 Å thick on the non-single-crystal semiconductor layer 7. As is the case with the non-single-crystal semiconductor layer 7, the non-single-crystal semiconductor layer 8N' also contains the recombination center neutralizer and has the microcrystalline or amorphous structure. And this semiconductor layer 8N' is also formed by the known plasma CVD method using either one or both of electric and optical energies.

The above is a description of the laminated member 5 formed on the electrode 2.

An electrode 61 is formed on the non-single-crystal semiconductor layer 8N' of the laminated member 5. The electrode 61 is a reflective electrode, which comprises a light transparent conductive layer 62 on the non-single-crystal semiconductor layer 8N' and a reflective conductive layer 63 on the light transparent conductive layer 62 in order that the electrode 61 may maintain its excellent ohmic contact with the non-single-crystal semiconductor layer 8N' and a high degree of reflectivity.

The light transparent conductive layer 62 of the electrode 61 is formed of a metal oxide. In the case where the non-single-crystal semiconductor layer 8N' contains phosphorus and is N-type, the abovesaid metal oxide is one that consists principally of indium oxide, such, for example, an indium oxide singly or indium oxide containing 1 to 10% of an antimony oxide.

The reflective electrode 63 of the electrode 62 is formed of metal, which is, for instance, aluminum (Al) or silver (Ag) when the metal oxide of the light transparent conductive layer 62 consists of indium oxide or principally of the indium oxide.

The above is a description of the arrangement of the first embodiment of the PIN type semiconductor photoelectric conversion device of the present invention.

The first embodiment of the PIN type semiconductor photo-electric conversion device of the present invention is provided with the laminated member 5, the light transparent electrode 2 and the reflective electrode 61, and is supported on the light transparent insulating substrate 1.

The laminated member 5 comprises the P-type non-single-crystal semiconductor layer 6P, the I-type non-single-crystal semiconductor layer 7 and the N-type non-single-crystal semiconductor layer 8N' laminated in this order and, consequently, the laminated member 5 has formed therein a PIN junction.

The light transparent electrode 2 and the reflective electrode 61 make ohmic contact with the non-single-crystal semiconductor layers 6P and 8N' of the laminated member 5, respectively. The light transparent electrode 2 is disposed on the side of the light transparent insulating substrate 1.

With such an arrangement, light 30 incident on this PIN type semiconductor photoelectric conversion device from the outside of the light transparent insulating substrate 1 enters into the laminated member 5 through the light transparent insulating substrate 1 and the light transparent electrode 2. The light having thus entered into the non-single-crystal semiconductor laminate memeber 5 passes through the non-single-crystal semiconductor layer 6P to reach the I-type non-single-crystal semiconductor layer 7, wherein it is absorbed.

This creates in the I-type non-single-crystal semiconductor layer 7 carriers (electron-hole pairs) corresponding to the incident light. The holes and electrons migrate into the P-type non-single-crystal semiconductor layer 6P and N-type non-single-crystal semiconductor layer 8N', respectively, from which they flow into the electrodes 2 and 61.

As a result of this, a potential difference developes between the electrodes 2 and 61, so that if a load is connected between the electrodes 2 and 61, then a current corresponding to the intensity of light 30 can be supplied to the load.

In this case, if a bias source is connected across the electrodes 2 and 61 in such a manner that the PIN junction may be reversely biased and if a thick depletion layer is formed in the I-type non-single-crystalline semiconductor layer 7, the holes and electrons in the carriers can effectively be drifted by a drift electric field of the depletion layer towards the non-single-crystal semiconductor layers 6P and 8N', respectively. Thus, a multiplied current can be supplied to the load.

According to the PIN type semiconductor photoelectric conversion device of the present invention shown in FIG. 1, the non-single-crystal semiconductor layer 6P on the side of incidence of the light 30, which forms the laminated member 5, contains the recombination center neutralizer and has the fibrous structure. Such a non-single-crystal semiconductor layer 6P has a light absorption coefficient far smaller than that of the non-single-crystal semiconductor layer formed of the same semiconductor material, containing the recombination center neutralizer and having the microcrystalline or amorphous structure as described previously in connection with FIG. 6.

Therefore, loss of the light 30 by its propagation to the non-single-crystal semiconductor layer 7 through the non-single-crystal semiconductor layer 6P is far smaller than in the case where the non-single-crystal semiconductor layer 6P has the microcrystalline or amorphous structure (corresponding to the non-single-crystal semiconductor layer in the conventional PIN type semiconductor photoelectric conversion device). Accordingly, the window effect of the non-single-crystal semiconductor layer 6P serving as a window for light is high.

Besides, the non-single-crystal semiconductor layer 6P containing the recombination center neutralizer and having fibrous structure has far higher electric conductivity than the non-single-crystal semiconductor layer formed of the same semiconductor material, containing the recombination center neutralizer and having microcrystalline or amorphous structure as described previously in respect of FIG. 7.

Owing to such high electric conductivity, holes in the carriers generated in the non-single-crystal semiconductor layer 7 migrate into the non-single-crystal semiconductor layer 6P and thence to the electrode 2 at higher speed and with far smaller loss than in the case where the non-single-crystal semiconductor layer 6P has the microcrystalline or amorphous structure (corresponding to the non-single-crystal semiconductor layer in the conventional PIN type semiconductor photoelectric conversion device).

According to the PIN type semiconductor photoelectric conversion device of the present invention illustrated in FIG. 1, the electrode 61 on the opposite side from the side of incidence of the light 30 is a reflective electrode.

With the provision of the reflective electrode 61, that portion of light reaching the non-single-crystal semiconductor layer 7 which is not absorbed by the non-single-crystal semiconductor layer 7 but instead passes through the non-single-crystal semiconductor layer 8N' towards the electrode 61 is reflected by the electrode 61 back to the non-single-crystal semiconductor layer 8N' to enter into the non-single-crystal semiconductor layer 7, wherein the reflected light is absorbed.

The reflective electrode 61 comprises of a light transparent conductive electrodes 62 deposited on the non-single-crystal semiconductor layer 8N' and a reflective conductive layer 63 on the light transparent conductive layer 62.

The light transparent conductive layer 62 is formed of indium or a metal oxide consisting principally of indium oxide when the N-type impurity contained in the non-single-crystal semiconductor layer 8N' is phosphorus. In this case, the reflective conductive layer 63 is formed of aluminium or silver.

Accordingly, the light transparent conductive layer 62 makes excellent ohmic contact with the non-single-crystal semiconductor layer 8N' and the reflective conductive layer 63. The reflective conductive layer 63 is formed of aluminum or silver, and hence has a large reflection coefficient.

Accordingly, the PIN type semiconductor photoelectric conversion device of the present invention, shown in FIG. 1, exhibits a markedly high photoelectric conversion efficiency and excellent light response characteristic as compared with those in the case where the non-single-crystal semiconductor layer 6P has the microcrystalline or amorphous structures and the electrode 61 is not the reflective one.

By the way, in the case where the non-single-crystal semiconductor layers 7 and 8N' was formed of silicon and the P-type non-single-crystal semiconductor layer 6P was formed of $Si_xC_{1-x}$ having an energy gap of 1.92 to 2.1 ev, the non-single-crystal semiconductor layer 6 exhibited an electric conductivity of 10 to 200 $(\Omega cm)^{-1}$ and, under the condition of AMI (100 mW/cm$^2$), photoelectric conversion efficiencies of 8 to 9% were obtained at voltages of 0.90 to 0.92 V. In contrast thereto, when the same construction as mentioned above was used except that the non-single-crystal semiconductor layer 6P was formed to have the microcrystalline or amorphous structure, the photoelectric conversion efficiency was only 7.5 to 8.5% at a voltage of 0.85 V.

According to the PIN type semiconductor photoelectric conversion device of the present invention, shown in FIG. 1, when the non-single-crystal semiconductor layer 7 is formed of silicon, if the energy gap of the non-single-crystal semiconductor layer 6P is made larger than the energy gap of the non-single-crystal semiconductor layer 7 by forming the P-type non-single-crystal semiconductor layer 6P of silicon carbide expressed by $Si_xC_{1-x}$ ($0<x<1$), then the window effect of the P-type non-crystalline semiconductive layer 6P serving as a window for light incident on the I-type non-single-crystal semiconductor layer 7 is heightened for long-wavelength light, too, improving the photoelectric conversion efficiency and response characteristic.

The PIN type photoelective conversion device of the present invention, shown in FIG. 1, which has the abovesaid advantages, is manufactured by a method including the following step for forming the non-single-crystal semiconductor layer 6P of the laminated member 5.

As described previsouly, the non-single-crystal semiconductor layer 6P is formed by the step in which the gas mixture M containing the semiconductor material gas G1, the recombination center neutralizer gas G2 and the P-type impurity material gas G3 is introduced into the reaction chamber 20 in which the insulating substrate 1 is positioned and the gas mixture M is made to undergo a chemical vapor reaction.

In this case, the insulating substrate 1 is disposed so that the top surface of the electrode 2 formed thereon may extend along the flow of the gas mixture M, and the chemical vapor reaction is carried out under the 0.1 to 10 Torr pressure and at 100° to 400° C. in the reaction chamber 20.

In this way, the non-single-crystal semiconductor layer 6P can be formed to have a small light absorption coefficient and high electric conductivity as described above. Since the non-single-crystal semiconductor layer 6P is formed at low temperatures ranging from 100° to 400° C., the recombination center neutralizer is not released from the layer 6P, providing it with sufficiently high electric conductivity.

By carrying out the aforementioned oxygen removing step prior to the formation of the non-single-crystal semiconductor layer 6P, its light transparency and conductivity can be further improved.

Accordingly, the manufacturing method of the present invention permits easy fabrication of the PIN type photoelectric conversion device which possesses the excellent features described above.

Next, a description will be given, with reference to FIG. 8, of a second embodiment of the PIN type photoelectric conversion device of the present invention.

Figure 8:
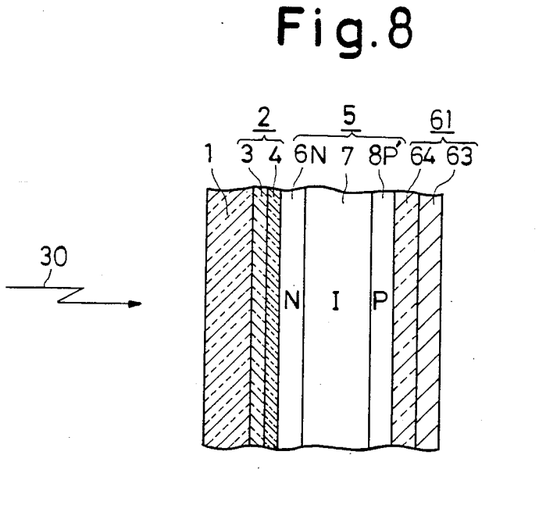
FIGS. 8, 9 and 10 are sectional views schematically illustrating second, third and fourth embodiments of the PIN type semiconductor photoelectric conversion device of the present invention, respectively.

In FIG. 8, the parts corresponding to those in FIG. 1 are identified by the same reference numerals and no detailed description will be given.

The second embodiment of the present invention shown in FIG. 8 is identical in construction with the embodiment of FIG. 1 except the following points. The first P-type non-single-crystal semiconductor layer 6P in the embodiment of FIG. 1, which contains recombination center neutralizer, is fibrous and forms the non-single-crystal semiconductor layer 5, substituted with a non-single-crystal semiconductor layer 6N which similarly contains the recombination center neutralizer and has the fibrous structure but is N-type.

Such an N-type non-single-crystal semiconductor layer 6N can be formed by the same method as described previously in respect of FIGS. 4 and 5 for the formation of the non-single-crystal semiconductor layer 6P in the embodiment of FIG. 1. In this case, however, an N-type impurity material gas G4 is introduced from an N-type impurity material gas source 40 into the aforementioned reaction chamber 20 via a needle valve 41 instead of the P-type impurity material gas G3. Besides, since the non-single-crystal semiconductor layer 6N is formed to contain an N-type impurity, there exists, between the flow quantity ratio ($Si_nH_m/H_2$) of the silane ($S_nH_m$) to the hydrogen ($H_2$) and the output W of the high-frequency electric energy, such a lower limit region characteristic as indicated by the curve 45 (in the case of the oxygen removing step being not involved) or 47 (in the case of the oxygen removing step being involved) in FIG. 5 which is lower than the characteristic indicated by the curve 37 or 43. Accordingly, the flow quantity ratio ($Si_nH_m/H_2$) between the silane ($Si_nH_m$) and the hydrogen ($H_2$) and the output W of the high-frequency electric energy are selected in a region 46 or 48 upwards of the curve 45 or 47.

The N-type non-single-crystal semiconductor layer 6N thus formed has also the same fibrous structure as described previously in respect of FIGS. 2 and 3 and has a small light absorption coefficient as described previously with regard to FIG. 6 for the P-type non-single-crystal semiconductor layer 6P in the embodiment of FIG. 1. Further, the layer 6N also is high in its electric conductivity as is the case with the layer 6P.

By the way, in the case where the N-type non-single-crystal semiconductor layer 6N was formed of silicon but contained hydrogen ($H_2$) through using silane ($Si_nH_m$) as the semiconductor material gas, phosphine ($PH_3$) as the N-type impurity material gas G4 and hydrogen ($H_2$) as the recombination center neutralizer, the relation of the electric conductivity C to the ratio (P/Si) between silicon (Si) and phosphorus (P) was such as indicated by the curve 80 in FIG. 7. In contrast thereto, in the cases where the non-single-crystal semiconductor layer 6N has the amorphous and microcrystalline structures, the electric conductivity C relative to the ratio (P/Si) is such as indicated by the curves 81 and 82 in FIG. 7.

The non-single-crystalline layer 8N' in the embodiment of FIG. 1 is substituted with a P-type non-single-crystal semiconductor layer 8P', which is also formed by the same manner as in the case of the non-single-crystal semiconductor layer 8N'.

Furthermore, the light transparent conductive layer 3 consisting of indium oxide or principally of the indium oxide and the light transparent conductive layer 4 consisting principally of the tin oxide, both of which made up the electrode 2, are exchanged in position in accordance with the substitution of the P-type non-single-crystal semiconductor layer 6P for the N-type one 6N, and the electrode 2 makes good ohmic contact with the N-type non-single-crystal semiconductor layer 6N through the light transparent conductive layer 4.

Moreover, the light transparent electrode 62, which is formed of a metal oxide consisting indium oxide or principally of the indium oxide and constitutes the electrode 61 in the embodiment of FIG. 1, is replaced with a light transparent conductive layer 64 formed of a metal oxide consisting of tin oxide or principally of tin oxide so as to obtain good ohmic contact with the P-type non-single-crystal semiconductor layer 8P'.

The above is the arrangement of the second embodiment of the present invention.

With such an arrangement, the second embodiment is identical in construction with the first embodiment of FIG. 1 except the abovesaid points, and hence possesses the same excellent features as those of the latter.

Figure 9:
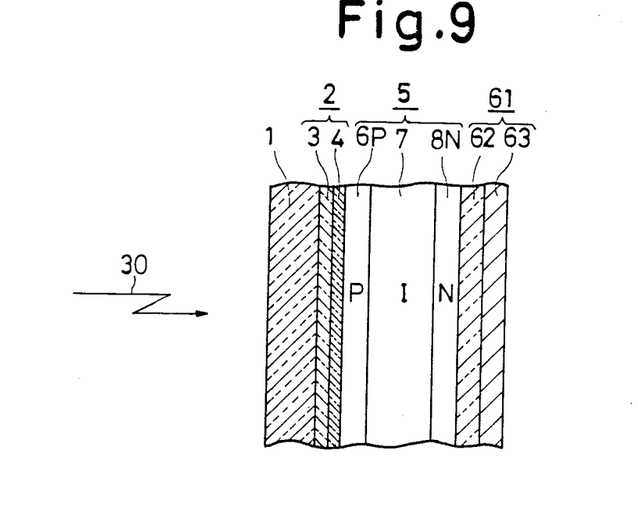

Turning next to FIG. 9, a third embodiment of the present invention will be described.

In FIG. 9, the parts corresponding to those in FIG. 1 are identified by the same reference numerals.

The third embodiment illustrated in FIG. 9 is also identical in construction with the first embodiment of FIG. 1 except the following point.

The N-type non-single-crystal semiconductor layer 8N' in the first embodiment of FIG. 1 is replaced with an N-type non-single-crystal semiconductor layer 8N which is opposite in conductivity type to the P-type non-single-crystal layer 6P but similarly contains the recombination center neutralizer and has the fibrous structure.

Such an N-type non-single-crystal semiconductor layer 8N is formed in the same manner as in the case of the N-type non-single-crystal semiconductor layer 6N described previously in respect of FIG. 8. Accordingly, the N-type layer 8N has a small light absorption coefficient and high electric conductivity as is the case with the P-type layer 6P.

The above is the third embodiment of the present invention.

With such an arrangement, the third embodiment is identical in construction with the first embodiment except the abovesaid point, and hence possesses the same excellent features as those of the latter.

Since the N-type non-single-crystal semiconductor layer 8N, which is disposed on the opposite side from the side of incidence of the light 30 with respect to the I-type non-single-crystal semiconductor layer 7, has a small light abosrption corfficient as is the case with the P-type non-single-crystal semiconductor layer 6P on the side on which the light 30 is incident, however, the N-type layer 8N inflicts only a small loss of light which is not absorbed by the I-type non-single-crystalline semiconductor layer 7 and passes through the non-single-crystal semiconductor layer 8N towards the electrode 61 and is then reflected by the electrode 61 back to the I-type non-single-crystal semiconductor layer 7. Furthermore, since the N-type non-single-crystal semiconductor layer 8N which makes ohmic contact with the electrode 61 has high electric conductivity as is the case with the P-type non-single-crystal semiconductor layer 6P which makes ohmic contact with the electrode 2, the carriers created in the I-type non-single-crystal semiconductor layer 7 can effectively be brought to the electrode 61.

Accordingly, it is possible with the third embodiment to obtain higher photoelectric conversion efficiency and response characterstcs than in the first embodiment of FIG. 1.

Figure 10:
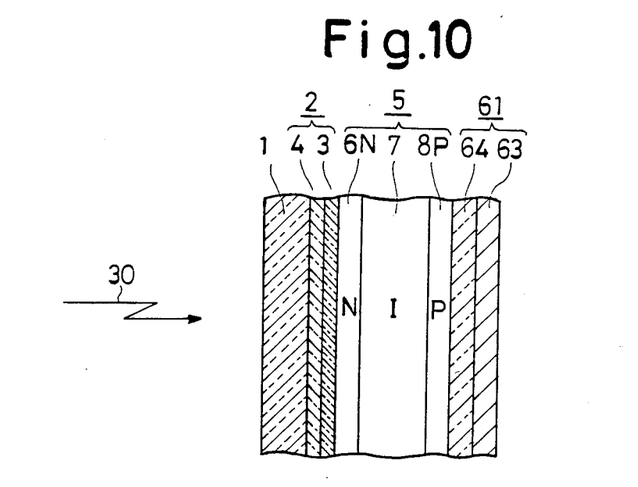

Referring next to FIG. 10, a fourth embodiment of the present invention will be described.

In FIG. 10 the parts corresponding to those in FIG. 8 are identified by the same reference numerals and no detailed description will be repeated.

The fourth embosiment of the present invention shown in FIG. 10 is identical in construction with the second embodiment of FIG. 8 except that the P-type non-single-crystal semiconductor layer 8P' in the latter is replaced with a P-type non-single-crystal semiconductor layer 8P which has the fibrous structure in common with the non-single-crystal semiconductor layer 8N described previously with regard to FIG. 9.

Accordingly, the fourth embodiment possesses the same excellent features obtainable with the third embodiment of FIG. 9, though not described in detail.

Figure 11:
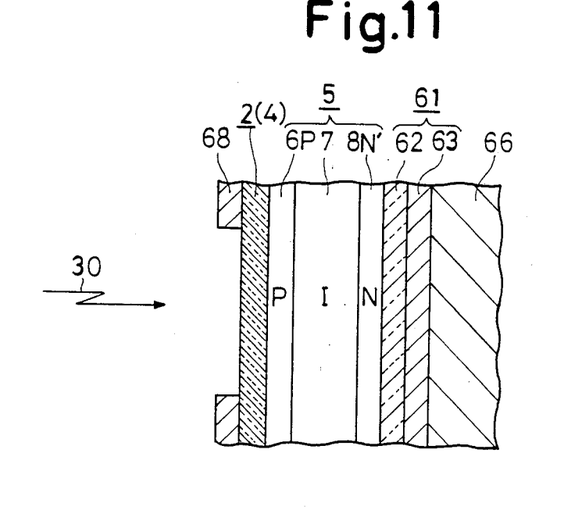
FIGS. 11, 12, 13 and 14 are sectional views schematically illustrating fifth, sixth, seventh and eighth embodiments of the PIN type semiconductor photoelectric conversion device of the present invention, respectively.

Turning next to FIG. 11, a fifth embodiment of the present invention will be described.

In FIG. 11 the parts corresponding to those in FIG. 1 are identified by the same reference numerals and no detailed description will be repeated. This embodiment is also identical in construction with the first embodiment of FIG. 1 except the following points.

In this fifth embodiment, the light transparent conductive layer 3 forming the electrode 2 in the first embodiment is left out and the light transparent insulating substrate 1 in the first embodiment is replaced with a substrate 66 as of ceramics, stainless steel or the like, on which a reflective conductive layer 63 forming the electrode 2, a light transparent conductive layer 62, the non-single-crystal semiconductor layers 8N', 7 and 6P forming the non-single-crystal laminate member 5 and the light transparent conductive layer 4 forming the electrode 2 are laminated in this order. In addition, a lead electrode 68 is connected to the light transparent conductive layer 4.

The above is a description of the fifth embodiment of the present invention.

With such an arrangement as described above, the fifth embodiment possesses the same features as those of the first embodiment, though not described in detail, since the former is idential with the latter except the abovesaid points.

Figure 12:
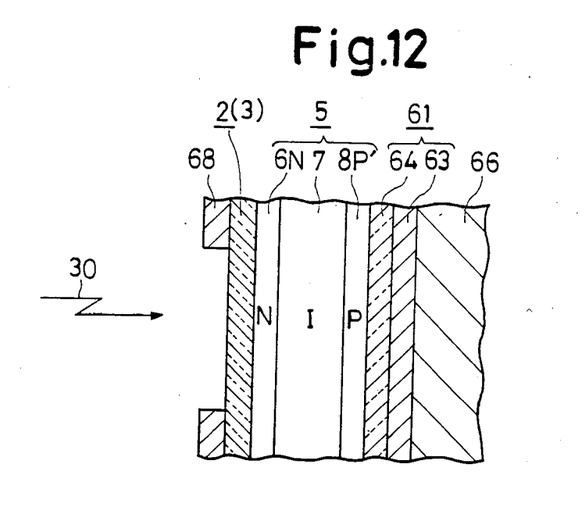

Referring next to FIG. 12, a sixth embodiment of the present invention will be described. In FIG. 12 the parts corresponding to those in FIG. 8 are identified by the same reference numerals.

In this embodiment, though not shown, the reflective conductive layer 63, the light transparent conductive layer 64, the non-single-crystal semiconductor layers 8P', 7 and 6N and the light transparent conductive layer 3 are laminated on the substrate 66 in this order and the lead electrode 68 is connected to the light transparent conductive layer 3 as in the case of the fifth embodiment described previously in connection with FIG. 11.

It will be seen that the sixth embodiment provides the same features as described previously in respect of FIG. 8.

Figure 13:
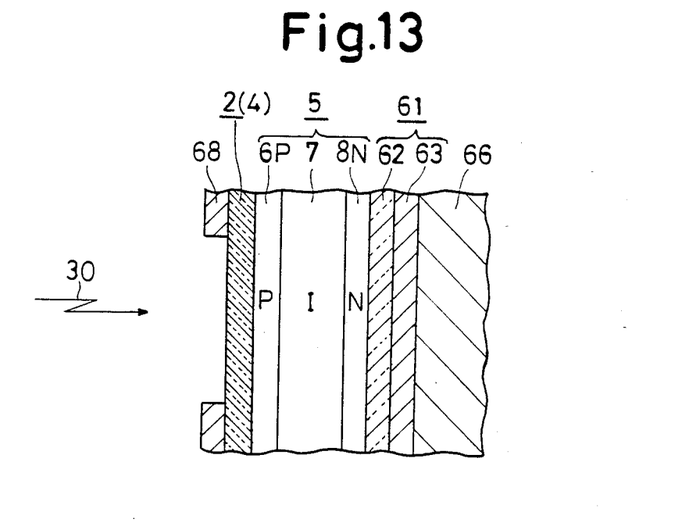

FIG. 13 illustrates a seventh embodiment of the present invention, in which the parts corresponding to those in FIG. 9 are identified by the same reference numaerals.

In this embodiment, though not described in detail, the reflective conductive layer 63, the light transparent conductive layer 62, the non-single-crystal semiconductor layers 8N, 7 and 6P and the light transparent conductive layer 4 are laminated in this order on the substrate 66 and the lead electrode 68 is deposited on the light transparent conductive layer 4 as in the fifth embodiment described previously with respect to FIG. 11.

It is evident that the seventh embodiment provides the same features as referred to previously in respect of FIG. 9.

Figure 14:
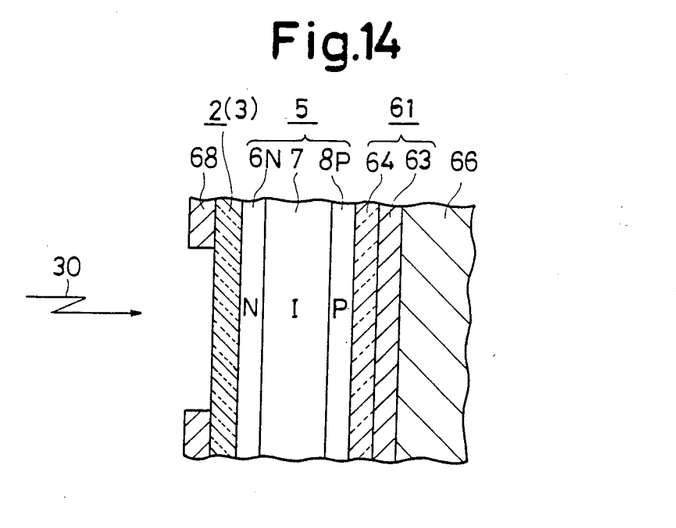

FIG. 14 illustrates an eighth embodiment of the present invention, in which the parts corresponding to those in FIG. 10 are identified by the same reference numerals.

In this embodiment, though not described in detail, the reflective conductive layer 63, the light transparent conductive layer 64, the non-single-crystal semiconductor layers 8P, 7 and 6N and the light transparent conductive layer 3 are laminated in this order on the substrate 66 and the lead electrode 68 is deposited on the light transparent conductive layer 3 as in the fifth embodiment described previously in respect of FIG. 11.

It is evident that the eighth embodiment provides the same features as mentioned previously in connection with FIG. 10.

It will be apparent that many modifications and variations may be effected without departing from the scope of the novel concepts of the present invention.

What is claimed is:

1. A PIN semiconductor photoelectric conversion device comprising:
   a laminated member including at least a first conductivity type first non-single-crystal semiconductor layer forming a first major surface of the laminated member, an I-type second non-single-crystal semiconductor layer, and a second conductivity type third non-single-crystal semiconductor layer forming a second major surface of the laminated member;
   a light transparent first electrode making ohmic contact with the first non-single-crystal semiconductor layer through which light enters in the laminated member; and
   a reflective second electrode formed on the third non-single-crystal semiconductor layer to make ohmic contact therewith;
   wherein the reflective second electrode has a light transparent conductive metal oxide layer formed on the third non-single-crystal semiconductor layer and a reflective conductive metal layer formed on the light transparent conductive layer;
   wherein the third non-single-crystal semiconductor layer contains phosphorus as an N-conductive type impurity and is N-type; and
   wherein the light transparent conductive metal oxide layer of the reflective electrode is made of indium oxide or a metal oxide consisting of indium oxide containing 1 to 10 weight percent of other materials.

2. A PIN semiconductor photoelectric conversion device according to claim 1, wherein the reflective conductive metal layer of the reflective electrode is made of aluminum or silver.

3. A PIN semiconductor photoelectric conversion device according to claim 1, wherein the first non-single-crystal semiconductor layer is P-type, contains a recombination center neutralizer and has a fibrous structure grown in a direction perpendicular to the surface of the first electrode and columnar in shape.

4. A PIN semiconductor photoelectric conversion device according to claim 1, wherein the third non-single-crystal semiconductor layer contains a recombination center neutralizer and has a fibrous structure grown in a direction perpendicular to the surface of the I-type second non-single-crystal semiconductor.

5. A PIN semiconductor photoelectric conversion device according to claim 1 wherein the first non-single-crystal semiconductor layer is P-type, contains a recombination center neutralizer and has a fibrous structure grown in a direction perpendicular to the surface of the first electrode and columnar in shape, and wherein the third non-single-crystal semiconductor layer contains a recombination center neutralizer and has a fibrous structure grown in a direction perpendicular to the surface of the I-type second non-single-crystal semiconductor.

6. A PIN semiconductor photoelectric conversion device according to claim 1, wherein the first non-single-crystal semiconductor layer is P-type and has larger energy band gap than does the I-type second non-single-crystal semiconductor.

7. A PIN semiconductor photoelectric conversion device comprising:
   a laminated member including at least a first conductivity type first non-single-crystal semiconductor layer forming a first major surface of the laminated member, an I-type second non-single-crystal semiconductor layer, a second conductivity type third non-single-crystal semiconductor layer forming a second major surface of the laminated member;
   a light transparent first electrode making ohmic contact with the first non-single-crystal semiconductor layers through which light enters in the laminated member; and
   a reflective second electrode formed on the third non-single-crystal semiconductor layer to make ohmic contact therewith;
   wherein the reflective second electrode has a light transparent conductive metal oxide layer formed on the third non-single-crystal semiconductor layer and a reflective conductive metal layer formed on the light transparent conductive layer;
   wherein the third non-single-crystal semiconductor layer contains boron as a P-conductivity type impurity and is P-type; and
   wherein the light transparent conductive metal oxide layer of the reflective electrode is made of tin oxide or a metal oxide consisting of tin oxide containing 1 to 10 weight percent of other materials.

8. A PIN semiconductor photoelectric conversion device according to claim 7, wherein the reflective conductive metal layer of the reflective electrode is made of aluminum on silver.

9. A PIN semiconductor photoelectric conversion device according to claim 7, whrein the first non-single-crystal semiconductor layer is P-type, contains a recombination center neutralizer and has a fibrous structure grown in a direction perpendicular to the surface of the first electrode and columnar in shape.

10. A PIN semiconductor photoelectric conversion device according to claim 7, wherein the third non-single-crystal semiconductor layer contains a recombination center neutralizer and has a fibrous structure grown in a direction perpendicular to the surface of the I-type second non-single-crystal semiconductor.

11. A PIN semiconductor photoelectric conversion device according to claim 7, wherein the first non-single-crystal semiconductor layer is P-type, contains a recombination center neutralizer and has a fibrous structure grown in a direction perpendicular to the surface of the first electrode and columnar in shape, and wherein the third non-single-crustal semiconductor layer contains a recombination center neutralizer and has a fibrous structure grown in a direction perpendicular to the surface of the I-type second non-single-crystal semiconductor.

12. A PIN semiconductor photoelectric conversion device according to claim 1, wherein the first non-single-crystal semiconductor layer is N-type and has larger energy band gap than does the I-type second non-single-crystal semiconductor.

13. A PIN semiconductor-photoelectric conversion device as in claim 1 where said light transparent electrode has a light transparent conductive metal oxide layer formed on the first non-single-crystal semiconductor layer wherein the first non-single-crystal semiconductor layer contains boron as a P-type conductivity type impurity and is P-type and where the light transparent conductive metal oxide layer of the first electrode is made of tim oxide or a metal oxide consisting of tin oxide containing 1 to 10 weight percent of further other materials.

14. A PIN semiconductor-photoelectric conversion device as in claim 7 where said light transparent electrode has a light transparent conductive metal oxide layer formed on the first non-single-crystal semiconductor layer wherein the first non-single-crystal semiconductor layer contains phosphorous as an N-type conductivity type impurity and is N-type and where the light transparent conductive metal oxide layer of the first electrode is made of indium oxide of a metal oxide consisting of indium oxide containing 1 to 10 weight percent of further other materials.

15. A PIN semiconductor-photoelectric conversion device as in claim 1 where said other materials consist essentially of tin oxide.

16. A PIN semiconductor-photoelectric conversion device as in claim 13 where said further other materials consist essentially of indium oxide.

17. A PIN semiconductor-photoelectric conversion device as in claim 7 wherein said other materials consist essentially of indium oxide.

18. A PIN semiconductor-photoelectric conversion device as in claim 14 where said further other materials consist essentially of tin oxide.

* * * * *